(12) United States Patent
Sugamoto et al.

(10) Patent No.: US 6,542,421 B2
(45) Date of Patent: *Apr. 1, 2003

(54) SEMICONDUCTOR MEMORY DEVICE WITH REDUNDANCY CIRCUIT

(75) Inventors: Hiroyuki Sugamoto, Kasugai (JP); Yasushige Ogawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/968,609

(22) Filed: Oct. 2, 2001

(65) Prior Publication Data

US 2002/0031023 A1 Mar. 14, 2002

Related U.S. Application Data

(63) Continuation-in-part of application No. 09/753,516, filed on Jan. 4, 2001, now Pat. No. 6,314,033.

(30) Foreign Application Priority Data

Jun. 5, 2000 (JP) ........................................ 2000-167357

(51) Int. Cl.$^7$ ................................................ G11C 7/00
(52) U.S. Cl. ............. 365/200; 365/189.01; 365/189.11; 365/189.05; 365/230.06
(58) Field of Search ........................... 365/200, 189.01, 365/189.11, 189.05, 189.12, 230.06, 230.08, 230.03

(56) References Cited

U.S. PATENT DOCUMENTS 5,206,831 A 4/1993 Wakamatsu .................. 365/200
6,314,033 B1 * 11/2001 Sugamoto et al. ...... 365/189.01

* cited by examiner

*Primary Examiner*—David Lam
(74) *Attorney, Agent, or Firm*—Arent Fox Kintner Plotkin & Kahn, PLLC

(57) ABSTRACT

This invention provides a semiconductor memory device with a shift redundancy circuit which has a shortened redundancy operation. The semiconductor memory device of the present invention includes a plurality of shift switches and a changeover signal generating circuit connected to the shift switches. The changeover signal generating circuit may have a plurality of signal generating blocks including a first signal generating block for generating a first group of changeover signals and a second signal generating block for generating a second group of changeover signals.

15 Claims, 14 Drawing Sheets

# SEMICONDUCTOR MEMORY DEVICE WITH REDUNDANCY CIRCUIT

CROSS-REFERENCE TO RELATED APPLICATION

This application is a Continuation-in-Part of U.S. patent application Ser. No. 09/753,516 now U.S. Pat. No. 6,314,033 entitled "SEMICONDUCTOR MEMORY DEVICE WITH REDUNDANCY CIRCUIT", filed on Jan. 4, 2001.

BACKGROUND OF THE INVENTION

The present invention relates to a semiconductor memory device, and, more particularly, to a semiconductor memory device with a redundancy circuit.

Demands for miniaturization, larger capacity and lower power consumption of semiconductor memory devices make it hard to fabricate semiconductor memory devices having defectless memories. To prevent the yield from dropping, a semiconductor memory device has a redundancy circuit.

FIGS. 1 and 2 are exemplary diagrams of a semiconductor memory device 1 such as Synchronous Dynamic Random Access Memory (SDRAM) having a conventional shift redundant type redundancy circuit. The semiconductor memory device 1 has 16 data bus lines DB0 to DB15 and a single redundancy data bus line DBs. First to sixteenth shift switches SW0 to SW15 are respectively located between the associated data bus lines DB0–DB15 and associated first to sixteenth input/output data lines DQ0 to DQ15. Each of the first to sixteenth shift switches SW0–SW15 is switched between an original position at which it connects the associated one of the first to sixteenth input/output data lines DQ0–DQ15 to the associated one of the first to sixteenth data bus lines DB0–DB15 and a shift position at which it connects the associated one of the first to sixteenth input/output data lines DQ0–DQ15 to the associated one of the second to sixteenth data bus lines DB1–DB15, higher by one bit than the associated input/output data line, and the redundancy data bus line DBs. For example, the sixteenth shift switch SW15 connects the sixteenth input/output data line DQ15 to the sixteenth data bus line DB15 or the redundancy data bus line DBs.

The switching actions of the first to sixteenth shift switches SW0–SW15 are controlled by a column redundancy address decoder 11 and a shift-switch changeover signal generator 12 both shown in FIG. 2. The redundancy address decoder 11 decodes a redundancy address signal and supplies the signal generator 12 with a changeover control signal which has bits corresponding in number to the first to sixteenth shift switches SW0–SW15.

The signal generator 12 has first to sixteenth transfer gates TG0–TG15 and a redundancy transfer gate TGs connected in series between a high-potential power supply VDD and a low-potential power supply VSS. Changeover signals which control the switching of the first to sixteenth shift switches SW0–SW15 are output from the individual nodes between the transfer gates TG0–TG15 and TGs. Each of the first to sixteenth shift switches SW0–SW15 is set to the original position in response to an H-level changeover signal and is set to the shift position in response to an L-level changeover signal.

When there is a defective memory cell connected to the fourteenth data bus line DB13, for example, the redundancy address signal that indicates the defective memory cell is supplied to the redundancy address decoder 11. The redundancy address decoder 11 supplies the signal generator 12 with the changeover signal which turns the transfer gate TG13 off and turns the redundancy transfer gate TGs on. This switching control sets the fourteenth to sixteenth shift switches SW13–SW15 to the shift positions (shift redundant operation). As a result, the fourteenth input/output data line DQ13 is connected to the fifteenth data bus line DB14, the fifteenth input/output data line DQ14 is connected to the sixteenth data bus line DB15, and the sixteenth input/output data line DQ15 is connected to the redundancy data bus line DBs.

In other words, the defective data bus line DB13 is switched to the normal upper-bit data bus line and the redundancy data bus line in the shift redundant system.

To meet the demands for a larger capacity and higher data transfer rate, the semiconductor memory device 1 is provided with a greater number of data bus lines. The increased number of data bus lines makes the time needed for the switching of the shift switches longer. Specifically, an RC delay occurs due to the ON resistances of the individual transfer gates TG0–TG15 and TGs, the capacitances of the lines that connect the individual shift switches SW0–SW15 and the junction capacitances of the transfer gates TG0–TG15 and TGs.

According to a column redundant method including row address information or so-called row flexible redundant method, particularly, a row address is determined first, then a column address is determined after which a shift redundant operation starts. Data reading or writing is initiated after switching of the shift switches is completed. Therefore, a delay in the switching of the shift switches makes the time needed for data reading or writing longer, thus delaying the operation of the semiconductor memory device 1.

SUMMARY OF THE INVENTION

Accordingly, it is an object of the present invention to provide a semiconductor memory device with a shift redundancy circuit which has a shortened redundancy operation.

The first aspect of the present invention provides a semiconductor memory device including a plurality of input/output data lines, a plurality of data bus lines, at least one redundancy data bus line, a plurality of shift switches, and a changeover signal generating circuit connected to the plurality of shift switches. The shift switches switch connections of the plurality of input/output data lines and a first group of the plurality of data bus lines to connections of the plurality of input/output data lines and a second group of the data bus lines, which exclude at least one defective data bus line, and the at least one redundancy data bus line in response to a plurality of changeover signals. The changeover signal generating circuit generates the plurality of changeover signals including a first group of changeover signals and a second group of changeover signals in response to a redundancy address signal. The changeover signal generating circuit has a plurality of signal generating blocks including a first signal generating block for generating the first group of changeover signals and a second signal generating block for generating the second group of changeover signals.

The second aspect of the present invention provides a semiconductor memory device including a plurality of input/output data lines, a plurality of data bus lines, at least one redundancy data bus line, a plurality of shift switches, a decoder circuit for decoding a redundancy address signal and generating a decoded redundancy address signal, and a changeover signal generating circuit connected to the decoder circuit and the plurality of shift switches. The shift switches switch connections of the plurality of input/output data lines and a first group of the plurality of data bus lines to connections of the plurality of input/output data lines and a second group of the data bus lines, which exclude at least one defective data bus line and the at least one redundancy data bus line in response to a plurality of changeover signals. The changeover signal generating circuit generates the plurality of changeover signals including a first group of changeover signals and a second group of changeover signals in response to the decoded redundancy address signal. The changeover signal generating circuit has a plurality of signal generating blocks including a first signal generating block for generating the first group of changeover signals and a second signal generating block for generating the second group of changeover signals. Each signal generating block includes a plurality of switches which are connected in series between a high-potential power supply and a low-potential power supply and are turned on or off in response to the decoded redundancy address signal.

This invention further provides a method of performing a redundancy process for compensating a semiconductor memory device for a defective memory cell. The method of the present invention entails the following steps: decoding a redundancy address signal and generating a decoded redundancy address signal; generating a plurality of changeover signals including a first group of changeover signals and a second group of changeover signals by operating a plurality of signal generating blocks in response to the decoded redundancy address signal; and switching connections of a plurality of input/output data lines and a first group of a plurality of data bus lines to connections of the plurality of input/output data lines and a second group of the data bus lines, which exclude at least one defective data bus line, and at least one redundancy data bus line by operating a plurality of shift switches in response to the plurality of changeover signals.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENT

A semiconductor memory device 20 according to one embodiment of the present invention will now be described referring to FIGS. 3 to 10.

Figure 1:
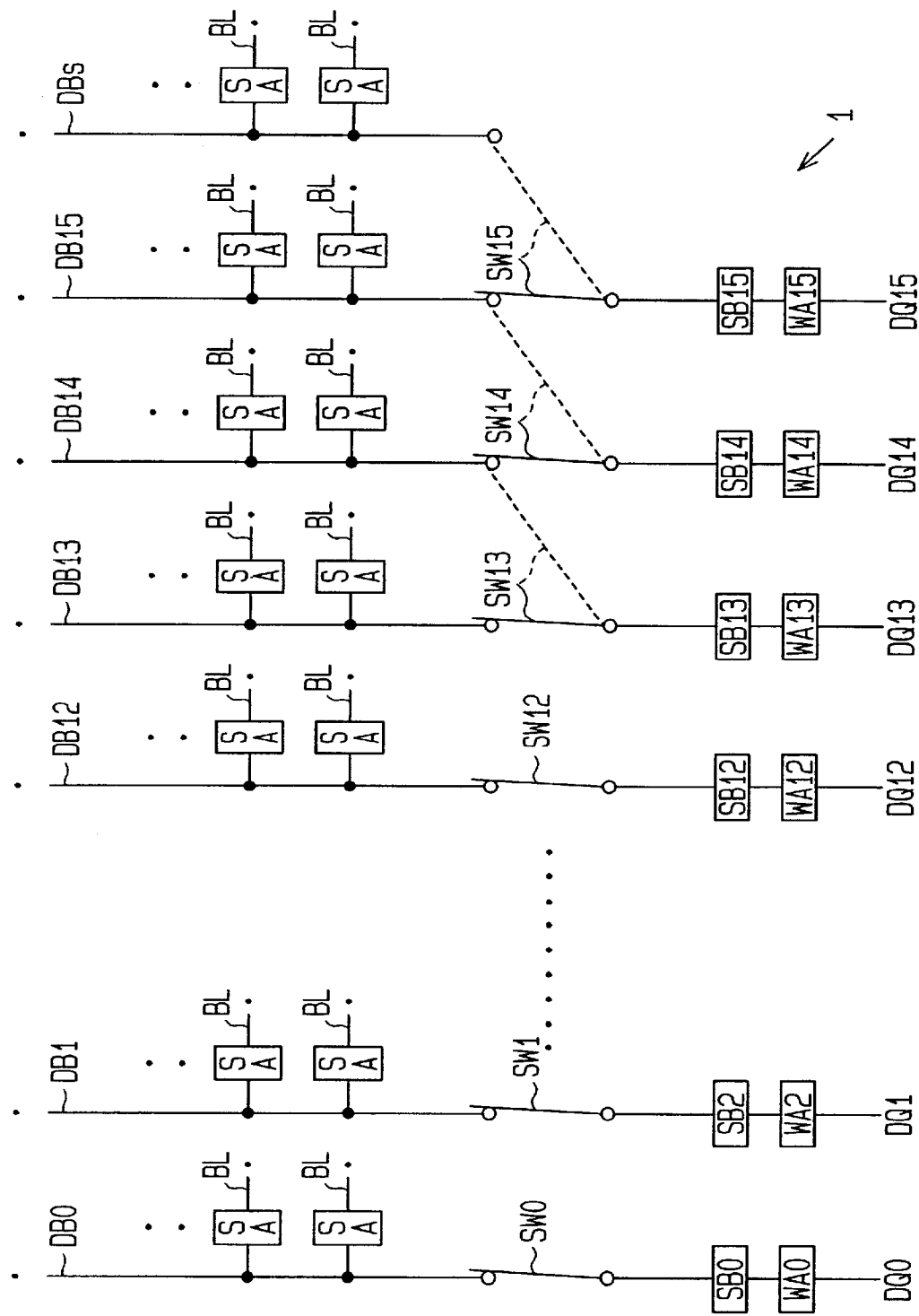
FIG. 1 is a schematic circuit diagram of a conventional SDRAM.
Figure 2:
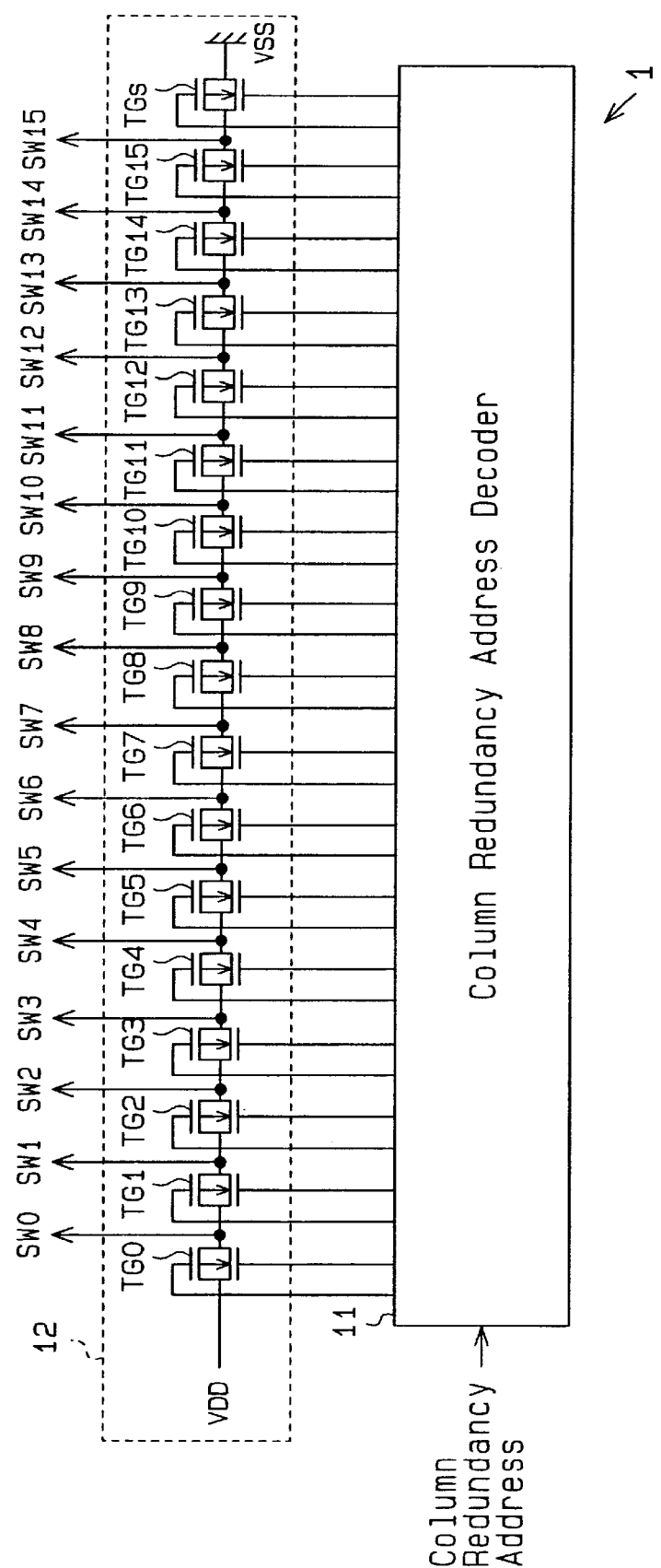
FIG. 2 is a schematic circuit diagram of a conventional shift switch signal generator.
Figure 3:
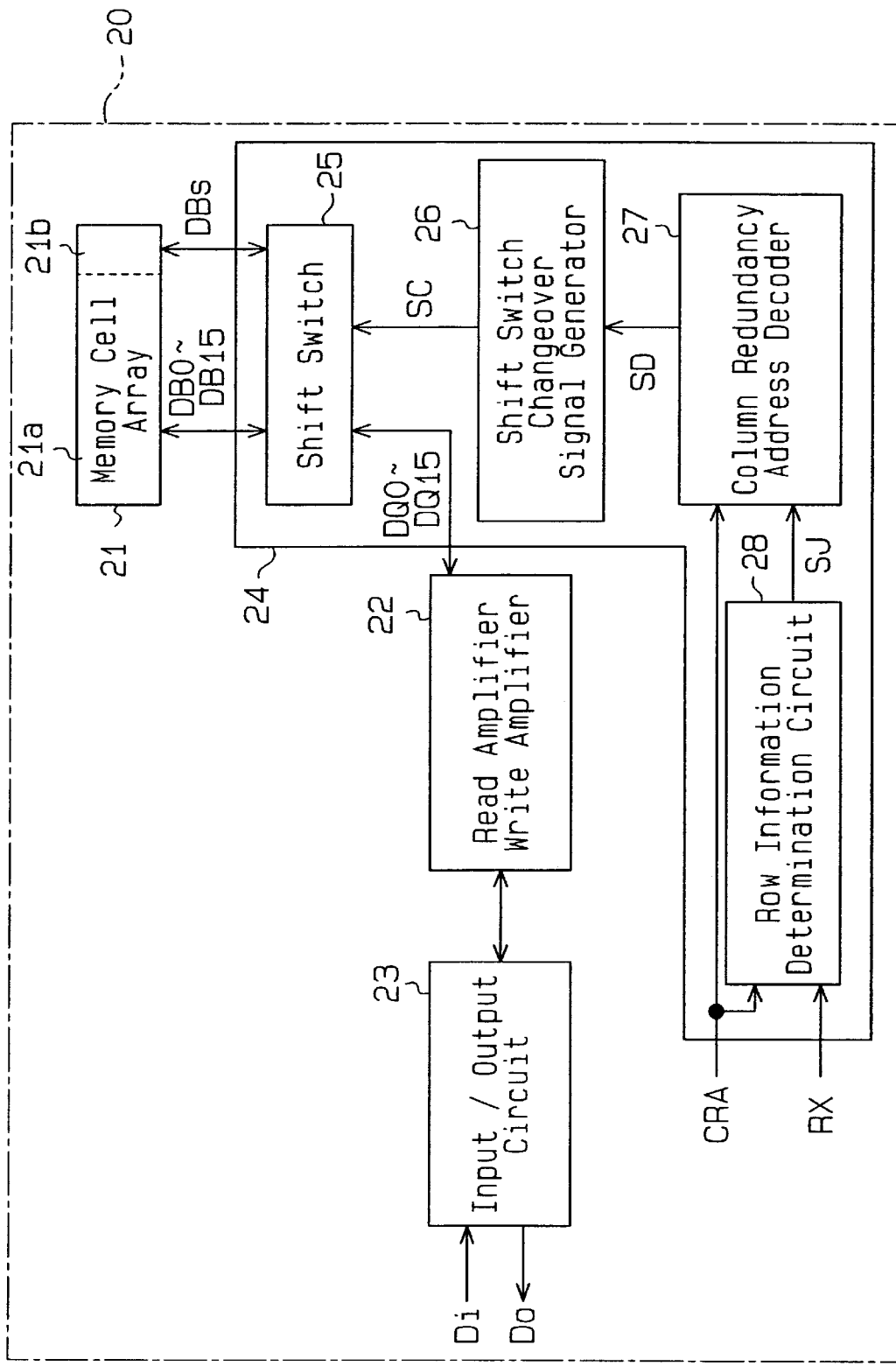
FIG. 3 is a schematic block diagram of a semiconductor memory device according to one embodiment of the present invention.

As shown in FIG. 3, the semiconductor memory device 20 comprises a memory cell array 21, an amplifier circuit 22, an input/output circuit 23 and a redundancy circuit 24. The redundancy circuit 24 includes a shift switch 25, a shift-switch changeover signal generator 26, a column redundancy address decoder 27 and a row information determination circuit 28.

The memory cell array 21 has a normal memory section 21a and a redundancy memory section 21b. The normal memory section 21a is connected to the shift switch 25 via first to sixteenth data bus lines DB0 to DB15. The redundancy memory section 21b is connected to the shift switch 25 via a redundancy data bus line DBs.

The shift switch 25 is connected to the amplifier circuit 22 via first to sixteenth input/output data lines DQ0 to DQ15. The amplifier circuit 22 has a read amplifier and a write amplifier. The read amplifier amplifies read data, which is supplied via the first to sixteenth input/output data lines DQ0–DQ15, and sends the amplified read data to the input/output circuit 23. The write amplifier amplifies write data, which is supplied from the input/output circuit 23, and supplies the amplified write data to the shift switch 25 via the first to sixteenth input/output data lines DQ0–DQ15.

The input/output circuit 23 receives an input signal Di to be stored in the memory cell array 21. The input/output circuit 23 outputs an output signal Do according to cell information read from the memory cell array 21.

The row information determination circuit 28 is connected to the column redundancy address decoder 27 and receives a row block address signal RX and a column redundancy address CRA. The column redundancy address CRA and row block address signal RX are generated by a column redundancy shifting circuit (not shown), such as an address buffer, by using defective information (row block and column addresses) stored in a non-volatile register (not shown). The row information determination circuit 28 determines whether the memory cell block which is selected by the row block address contains a defective memory cell in accordance with the row block address signal RX and the column redundancy address CRA. The row information determination circuit 28 generates and sends a determination signal SJ to the column redundancy address decoder 27. The column redundancy address decoder 27 generates the decoded redundancy address signal in response to the determination signal SJ.

The column redundancy address decoder 27 determines a redundancy unit to be used in the redundancy operation from among a plurality of redundancy units in accordance with the determination signal SJ and the column redundancy address CRA, and sends a decode signal SD according to the determination to the shift-switch changeover signal generator 26. That is, the column redundancy address decoder 27 decodes the column redundancy address CRA and sends the decode signal SD to the changeover signal generator 26 in accordance with the determination signal SJ.

The changeover signal generator 26 outputs a changeover signal SC for controlling the shift switch 25 according to the decode signal SD.

The shift switch 25 includes a plurality of switches that are turned on or off in response to the changeover signal SC. Switching the switches causes the first to sixteenth input/output data lines DQ0–DQ15 to be switched to those input/output data bus lines which exclude a defective data bus line (the data bus line to which a defective memory cell is connected) and the redundancy data bus line DBs.

The redundancy unit will now be discussed.

Figure 9:
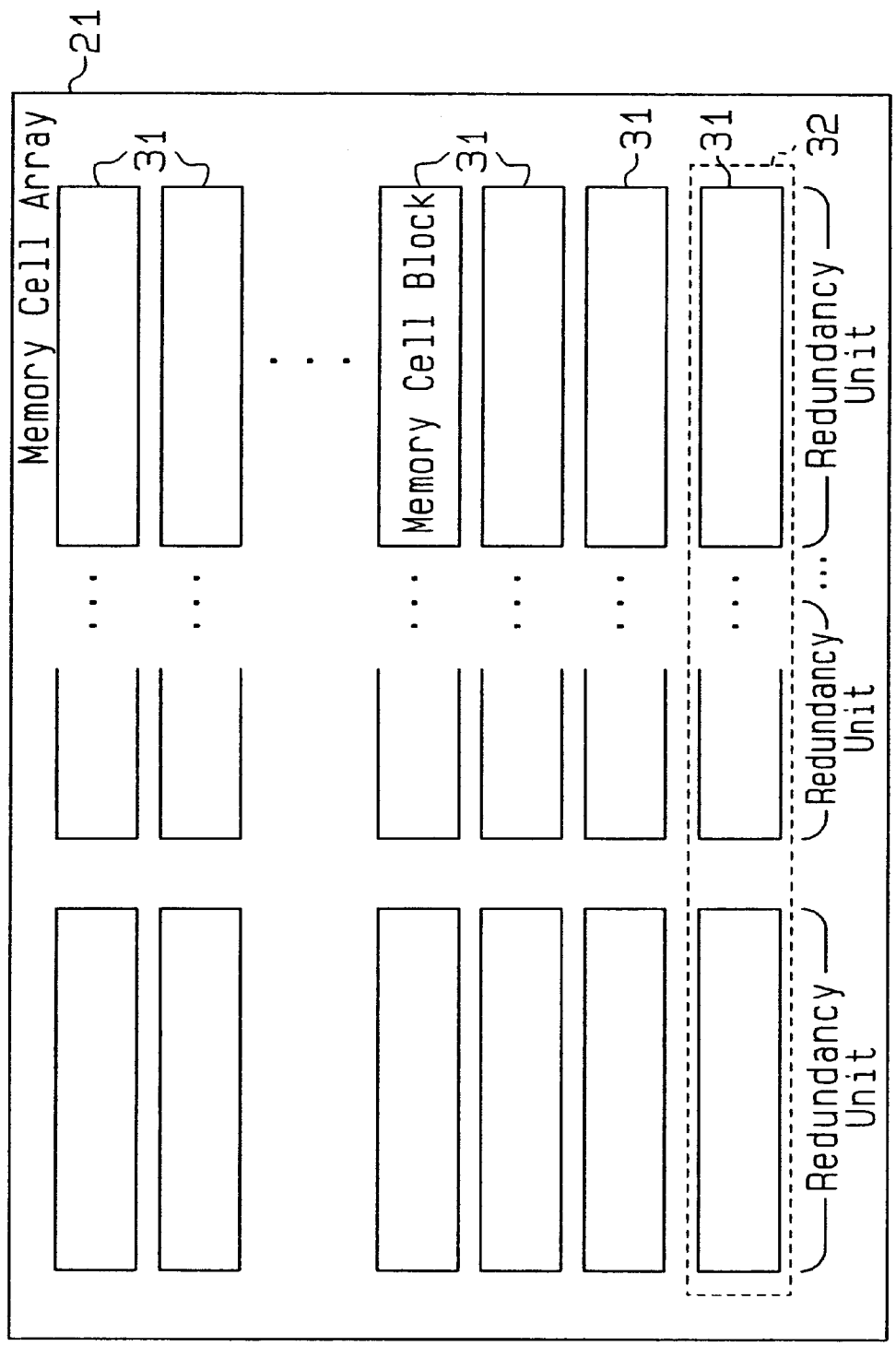
FIG. 9 is a schematic block diagram of a memory cell array of the semiconductor memory device in FIG. 3.

As shown in FIG. 9, the memory cell array 21 has a plurality of memory cell blocks 31 laid out in a matrix form. To be more specific, the memory cell array 21 has a plurality of row blocks 32 and a plurality of column blocks. Each row block 32 has a plurality of memory cell blocks 31 laid along a word line. Each column block has a plurality of memory cell blocks 31 laid along a bit line. Each memory cell block 31 has sixteen memory cells corresponding to the first to sixteenth input/output data lines DQ0–DQ15. In this embodiment, a single memory cell block 31 is a redundancy unit. A single redundancy unit may be comprised of a predetermined number of memory cell blocks.

Figure 10:
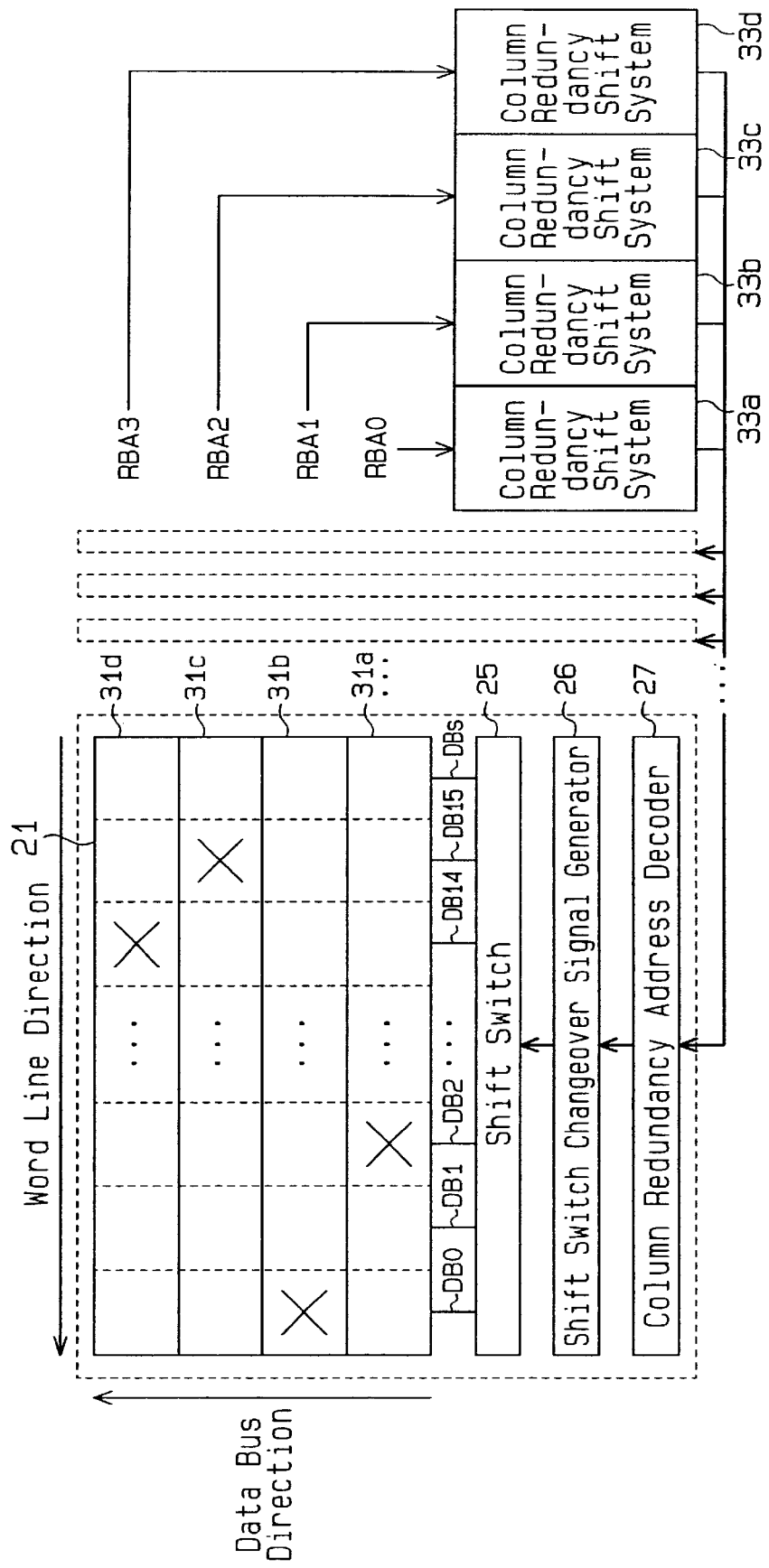
FIG. 10 is an explanatory diagram for flexible redundancy.

The flexible redundant method will be discussed below with reference to FIG. 10. To simplify the description, the memory cell array 21 is illustrated in FIG. 10 to have four memory cell blocks 31a to 31d corresponding to the row block addresses RBA0 to RBA3. First to fourth column redundancy shift circuits 33a to 33d respectively store the block addresses RBA0–RBA3 of the memory cell blocks 31a–31d. A single redundancy data bus line DBs is assigned to each of the memory cell blocks 31a–31d. Suppose that there is a single defect in each of the memory cell blocks 31a–31d. For example, the first memory cell block 31a contains a defective memory cell connected to the third data bus line DB2. The second memory cell block 31b contains a defective memory cell connected to the first data bus line DB0. The third memory cell block 31c contains a defective memory cell connected to the sixteenth data bus line DB15, and the fourth memory cell block 31d contains a defective memory cell connected to the fifteenth data bus line DB14.

In accessing the first memory cell block 31a, the column redundancy shift circuit 33a outputs the row block address signal RX. The column redundancy address decoder 27 and changeover signal generator 26 control the shift switch 25 to isolate the third data bus line DB2 that is connected to a defective memory cell in accordance with the row block address signal RX and the column redundancy address CRA. Specifically, the associated switch in the shift switch 25 is switched to the shift position. Consequently, the third to sixteenth data bus lines DB2–DB15 and the redundancy data bus line DBs are respectively connected to the second to sixteenth input/output data lines DQ1–DQ15.

In accessing the second memory cell block 31b, the first data bus line DB0 that is connected to a defective memory cell is isolated. Then, the second to sixteenth data bus lines DB1–DB15 and the redundancy data bus line DBs are respectively connected to the first to sixteenth input/output data lines DQ0–DQ15.

In accessing the third memory cell block 31c, the sixteenth data bus line DB15 that is connected to a defective memory cell is isolated. Then, the redundancy data bus line DBs is connected to the sixteenth input/output data line DQ15.

In accessing the fourth memory cell block 31d, the fifteenth data bus line DB14 that is connected to a defective memory cell is isolated. Then, the sixteenth data bus line DB15 and the redundancy data bus line DBs are respectively connected to the fifteenth and sixteenth input/output data lines DQ14 and DQ15.

As apparent from the above, the provision of a single redundancy data bus line DBs for each redundancy unit can compensate for a single defect for each of the memory cell blocks 31a–31d.

Figure 4A:
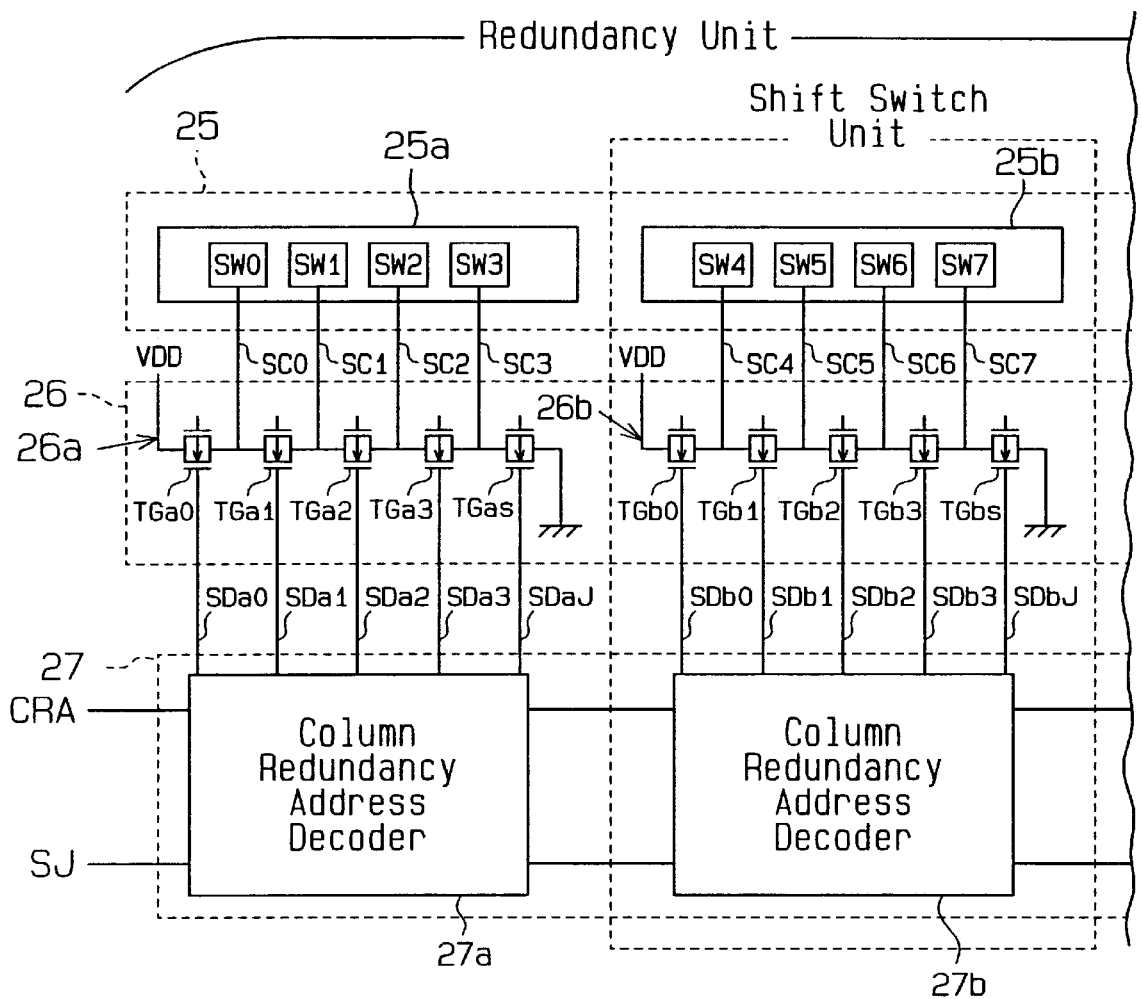
FIGS. 4A and 4B are schematic block diagrams of a redundancy circuit in the semiconductor memory device in FIG. 3.
Figure 4B:
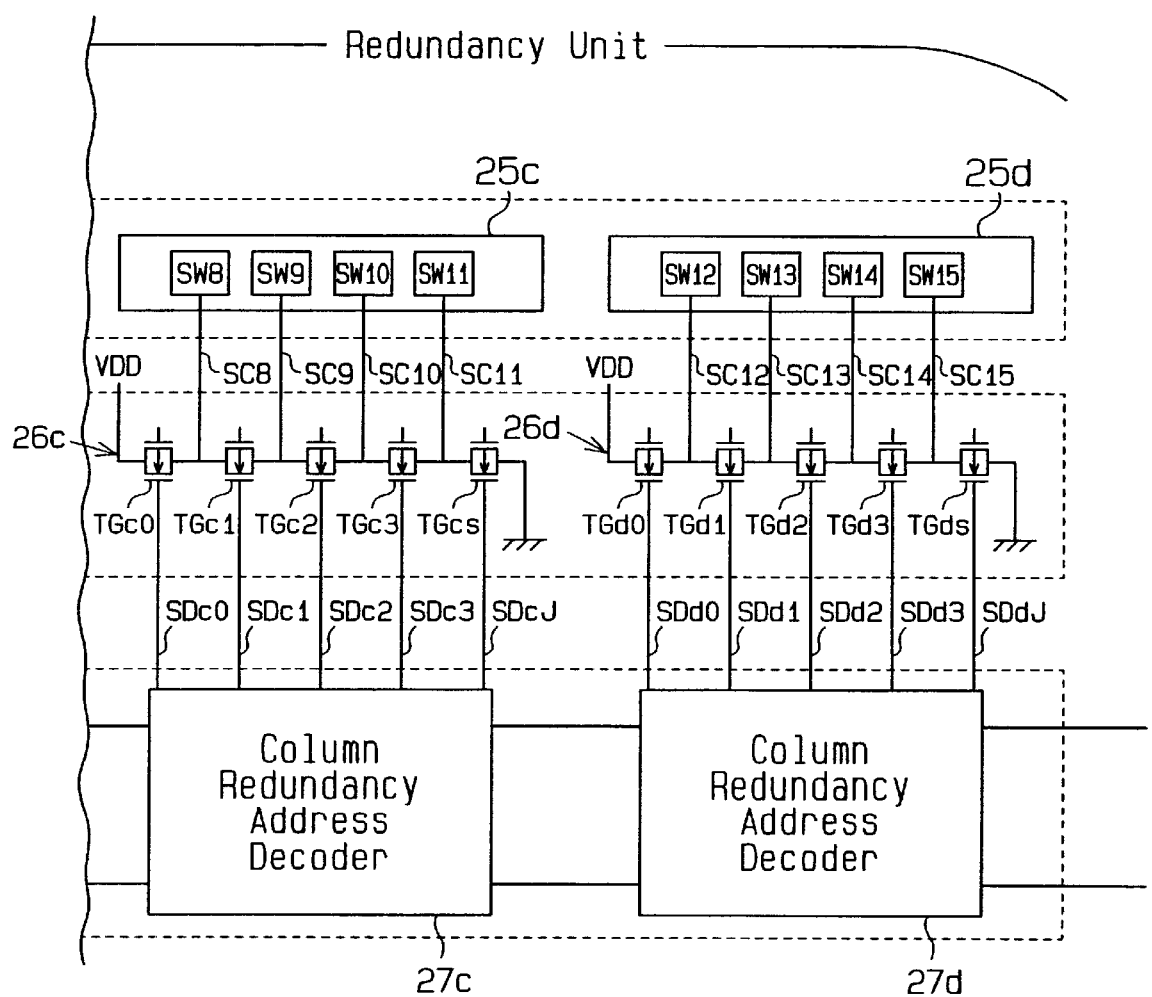

FIGS. 4A and 4B are schematic block diagrams of the redundancy circuit 24 in the semiconductor memory device 20. The shift switch 25 includes 16 shift switches SW0–SW15 corresponding to the first to sixteenth input/output data lines DQ0–DQl5. The first to fourth shift switches SW0–SW3 form a first shift switch group 25a, the fifth to eighth shift switches SW4–SW7 form a second shift switch group 25b, the ninth to twelfth shift switches SW8–SW11 form a third shift switch group 25c, and the thirteenth to sixteenth shift switches SW12–SW15 form a fourth shift switch group 25d.

The changeover signal generator 26 includes four signal generating blocks 26a to 26d. The number of blocks, n (an integer equal to or greater than 2), is set in accordance with the number of data bus lines, m, and the target time for shift operation. In this embodiment, the block quantity n is set to "4". The signal generating block 26a generates four changeover signals SC0 to SC3, for controlling the shift-switching of the shift switches. The signal generating block 26b generates four changeover signals SC4 to SC7 for controlling the shift-switching of the shift switches. Likewise, the signal generating block 26c generates four changeover signals SC8 to SC11 for controlling the shift-switching of the shift switches, and the signal generating block 26d generates four changeover signals SC12 to SC15 for controlling the shift-switching of the shift switches.

Specifically, the first block 26a includes four transfer gates TGa0 to TGa3 and one redundancy transfer gate TGas connected in series between a high-potential power supply VDD and a low-potential power supply VSS. The transfer gates TGa0–TGa3 generate the first to fourth changeover signals SC0–SC3 for controlling the switching of the first to fourth shift switches SW0–SW3. The first to fourth changeover signals SC0–SC3 are output from the respective nodes between the transfer gates TGa0–TGa3 and TGas.

The second block 26b includes four transfer gates TGb0 to TGb3 and one redundancy transfer gate TGbs connected in series between the high-potential power supply VDD and the low-potential power supply VSS. The transfer gates TGb0–TGb3 generate the fifth to eighth changeover signals SC4–SC7.

The third block 26c includes four transfer gates TGc0 to TGc3 and one redundancy transfer gate TGcs connected in series between the high-potential power supply VDD and the low-potential power supply VSS. The transfer gates TGc0–TGc3 generate the ninth to twelfth changeover signals SC8–SC11.

The fourth block 26d includes four transfer gates TGd0 to TGd3 and one redundancy transfer gate TGds connected in series between the high-potential power supply VDD and the low-potential power supply VSS. The transfer gates TGd0–TGd3 generate the thirteenth to sixteenth changeover signals SC12–SC15.

The column redundancy address decoder 27 includes four decoder blocks 27a to 27d respectively corresponding to the four signal generating blocks 26a–26d. Each of the decoder blocks 27a–27d generates decode signals SDa0 to SDa3, SDb0 to SDb3, SDc0 to SDc3 or SDd0 to SDd3 and the redundancy decode signal SDaJ, SDbJ, SDcJ or SDdJ to shift the switches in accordance with the column redundancy address CRA and the determination signal SJ.

When there is a defective data bus line, each of the decoder blocks 27a–27d generates the decode signals that turn off the transfer gate in the signal generating block 26a, 26b, 26c or 26d which is associated with the defective data bus line and turn on the redundancy transfer gate.

All the decoder blocks that correspond to the data bus lines of upper bits than the bit of the defective data bus line generate the decode signals that turn off the first transfer gate in each decoder block and turn on the remaining transfer gates and the associated redundancy transfer gates.

A description will now be given of the case where the second data bus line DB1 is defective.

The first decoder block 27a turns off the second transfer gate TGa1 corresponding to the second data bus line DB1 and turns on the first, third and fourth transfer gates TGa0, TGa2 and TGa3 and the redundancy transfer gate TGas using the decode signals SDa0–SDa3 and the redundancy decode signal SDaJ. The actions of the individual transfer gates causes the first signal generating block 26a to output the H-level first changeover signal SC0 and the L-level second to fourth changeover signals SC1–SC3.

The time needed to switch the levels of the second to fourth changeover signals SC1–SC3 from the H levels to the L levels in the first signal generating block 26a is determined only by the RC delay time that is produced as the three transfer gates TGa2, TGa3 and TGas are turned on. The RC delay time is shorter than the RC delay time that is produced by switching of the fifteen transfer gates (the third to sixteenth transfer gates TG2–TG15 and the redundancy transfer gate TGs).

The second to fourth decoder blocks 27b–27d of upper bits than the bit of the first decoder block 27a turn off the first transfer gates TGb0, TGc0 and TGd0 and turn on the second to fourth transfer gates TGb1–TGb3, TGc1–TGc3 and TGd1–TGd3 and the redundancy transfer gates TGbs, TGcs and TGds using the decode signals SDb0–SDb3, SDc0–SDc3, SDd0–SDd3, SDbJ, SDcJ and SDdJ. Accordingly, the second to fourth signal generating blocks 26b–26d respectively output the L-level fifth to eighth changeover signals SC4–SC7, the ninth to twelfth changeover signals SC8–SC11 and the thirteenth to sixteenth changeover signals SC12–SC15.

The time needed to switch the levels of the changeover signals SC4–SC7, SC8–SC11 or SC12–SC15 from the H levels to the L levels in each of the second to fourth signal generating blocks 26b–26d is determined only by the RC delay time that is produced as the associated four transfer gates TGb1–TGb3 and TGbs 2, TGc1–TGc3 and TGcs, or TGd1–TGd3 and TGds are turned on. The signal changeover time is therefore shorter than the conventional changeover time.

The effect of shortening the signal changeover time is also acquired in the case of switching the signal level from the L level to the H level. That is, the changeover time of the first to fourth changeover signals is determined only by the RC delay time that is produced by the actions of the four transfer gates at a maximum. The RC delay is nearly the same for the signal generating blocks 26b–26d of upper bits than the bit of the signal generating block that corresponds to a defective data bus line.

The shift switch 25 will be discussed below with reference to FIG. 5A, which schematically shows the tenth and eleventh shift switches SW9 and SW10.

The tenth shift switch SW9 includes first to fourth transfer gates 41 to 44 and an inverter circuit 45. Each of the transfer gates 41–44 comprises a PMOS transistor and an NMOS transistor.

The first transfer gate 41, which is connected between a tenth input/output data line DQ9z and tenth data bus line DB9z, selectively connects the tenth input/output data line DQ9z to the tenth data bus line DB9z. The second transfer gate 42, connected between a tenth input/output data line DQ9x and tenth data bus line DB9x, selectively connects the tenth input/output data line DQ9x to the tenth data bus line DB9x. The third transfer gate 43, connected between the tenth input/output data line DQ9z and an eleventh data bus line DB10z, selectively connects the tenth input/output data line DQ9z to the eleventh data bus line DB10z. The fourth transfer gate 44, connected between the tenth input/output data line DQ9x and an eleventh data bus line DB10x, selectively connects the tenth input/output data line DQ9x to the eleventh data bus line DB10x.

The tenth changeover signal SC9 is supplied to the gates of the PMOS transistors of the first and second transfer gates 41 and 42 and the NMOS transistors of the third and fourth transfer gates 43 and 44. The tenth changeover signal SC9 is also supplied to the gates of the NMOS transistors of the first and second transfer gates 41 and 42 and the PMOS transistors of the third and fourth transfer gates 43 and 44 via the inverter circuit 45.

When the tenth changeover signal SC9 has an L level, the first and second transfer gates 41 and 42 are turned on and the third and fourth transfer gates 43 and 44 are turned off. As a result, the pair of tenth input/output data lines DQ9z and DQ9x are respectively connected to the pair of tenth data bus lines DB9z and DB9x and are respectively isolated from the pair of eleventh data bus lines DB10z and DB10x. When the tenth changeover signal SC9 has an H level, instead, the first and second transfer gates 41 and 42 are turned off and the third and fourth transfer gates 43 and 44 are turned on. As a result, the pair of tenth input/output data lines DQ9z and DQ9x are respectively connected to the pair of eleventh data bus lines DB10z and DB10x and are respectively isolated from the pair of tenth data bus lines DB9z and DB9x.

That is, the tenth shift switch SW9 connects the tenth input/output data line pair DQ9z and DQ9x to the tenth data bus line pair DB9z and DB9x or the eleventh data bus line pair DB10z and DB10x in response to the tenth changeover signal SC9.

The eleventh shift switch SW10 operates in the same way as the tenth shift switch SW9 in response to the eleventh changeover signal SC10. Likewise, the first to ninth and twelfth to sixteenth shift switches SW0–SW8 and SW11–SW15 operate in a similar manner in response to the changeover signals SC0–SC8 and SC11–SC15.

Figure 6:
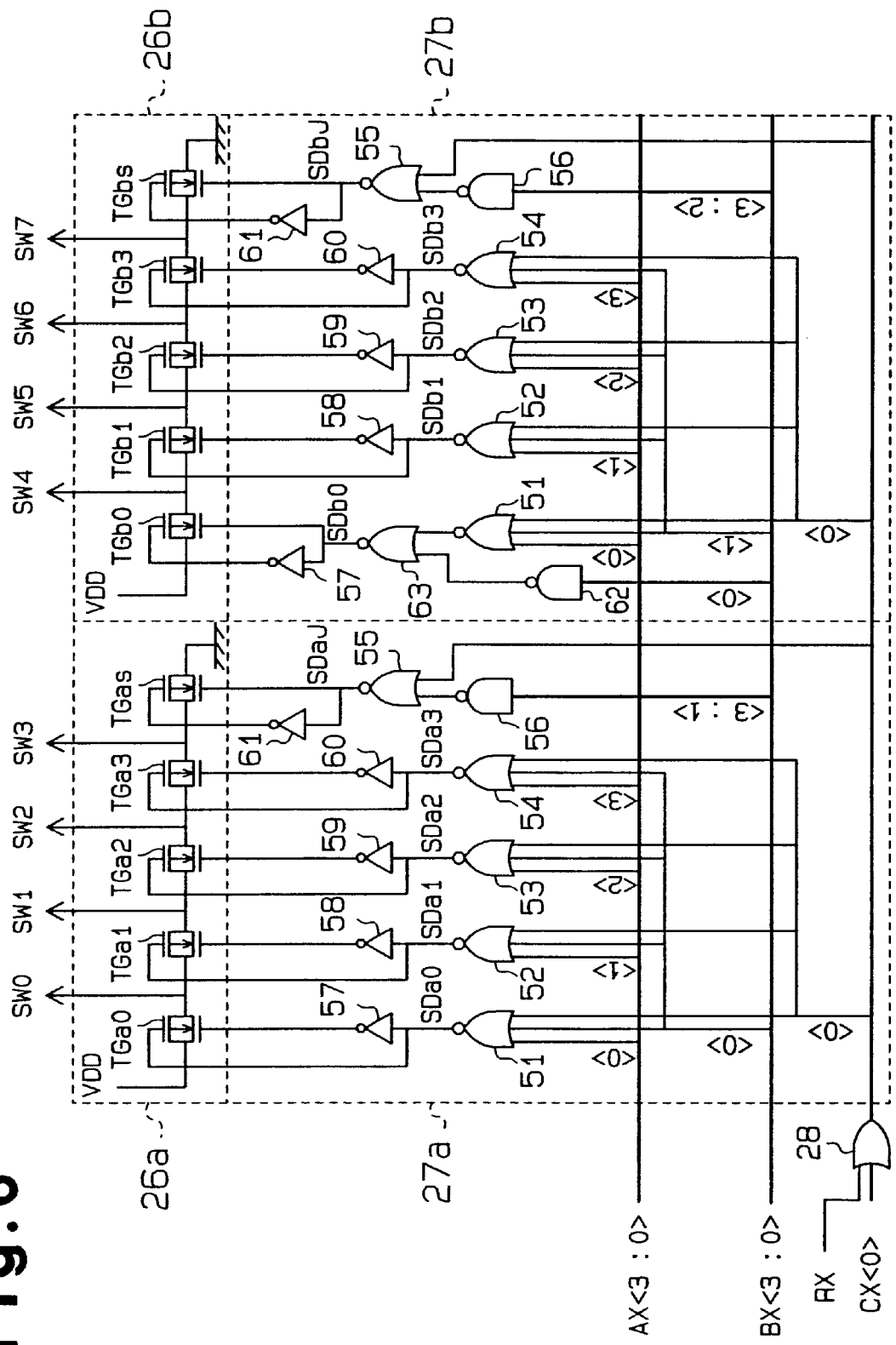
FIGS. 6 and 7 are schematic circuit diagrams of a column redundancy address decoder and a shift-switch changeover signal generator in the semiconductor memory device in FIG. 3.
Figure 7:
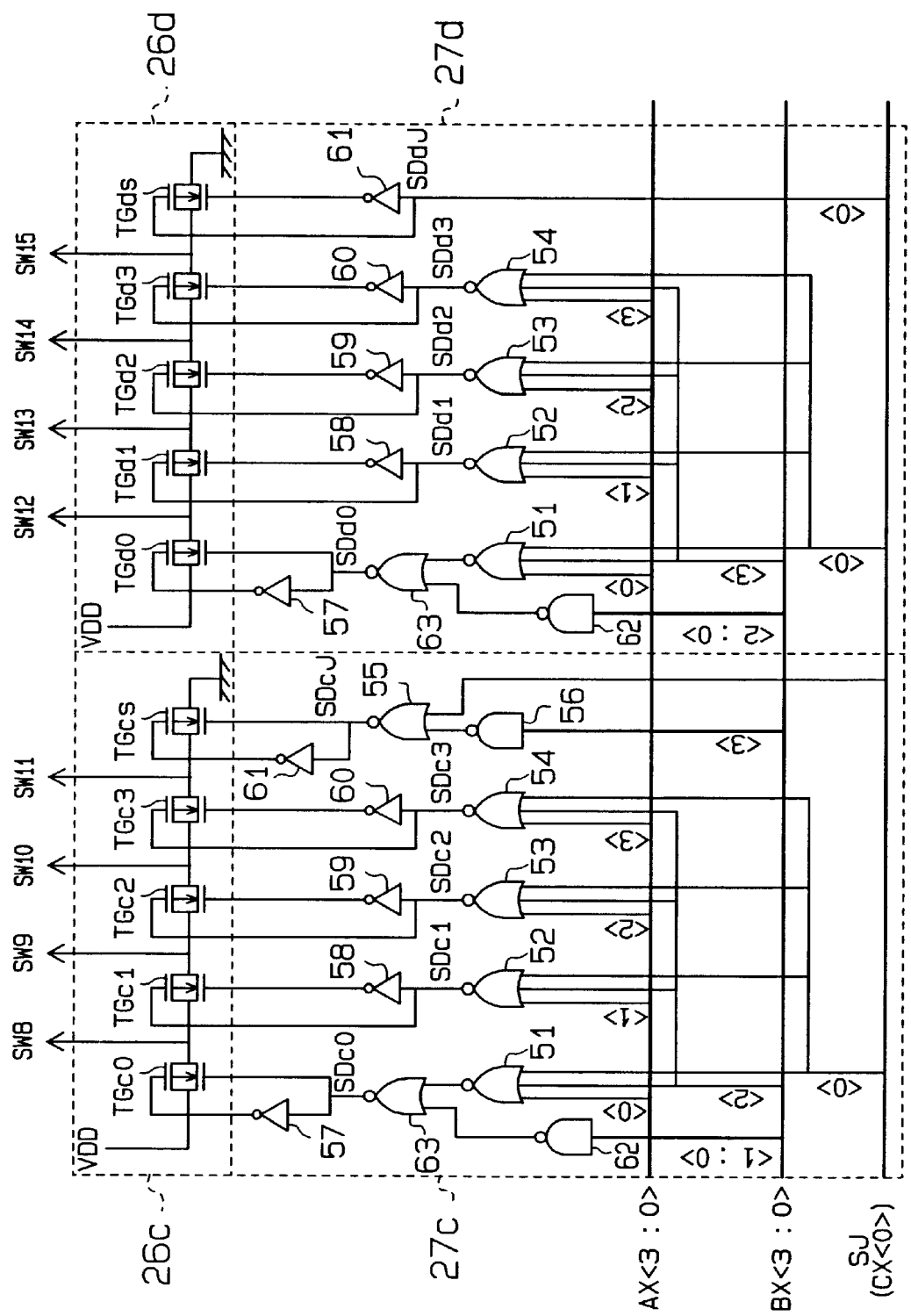

FIG. 6 is a schematic circuit diagram showing the first and second signal generating blocks 26a and 26b, the first and second decoder blocks 27a and 27b and the determination circuit 28. FIG. 7 is a schematic circuit diagram showing the third and fourth signal generating blocks 26c and 26d, and the third and fourth decoder blocks 27c and 27d.

Referring to FIGS. 6 and 7, the column redundancy address CRA has a plurality of bits and includes three address signals AX<3:0>, BX<3:0> and CX<3:0>. <3:0> indicates that the number of bits is 4.

The determination circuit 28 includes an OR gate and receives the row block address signal RX and the redundancy address signal CX<0>. When the row block address signal RX has an L level, the determination circuit 28 outputs the redundancy address signal CX<0> (determination signal SJ).

The first decoder block 27a includes five NOR gates 51 to 55, a NAND gate 56 and five inverter circuits 57 to 61. Each of the first to fourth NOR gates 51–54 has three input terminals for receiving the first address signal AX<0>, AX<1>, AX<2> or AX<3>, and the second and third address signals BX<0> and CX<0>. The first to fourth NOR gates 51–54 respectively supply the first to fourth decode signals SDa0–SDa3 to the first to fourth transfer gates TGa0–TGa3.

Each of the first to fourth transfer gates TGa0–TGa3 is a CMOS transistor, needs a shorter time for charging and discharging of the node and performs a fast shift operation. The first to fourth decode signals SDa0–SDa3 are respectively supplied to the gates of the PMOS transistors of the transfer gates TGa0–TGa3. The signals that are acquired by inverting the first to fourth decode signals SDa0–SDa3 in the inverter circuits 57–60 are respectively supplied to the gates of the NMOS transistors of the transfer gates TGa0–TGa3.

The NAND gate 56 has an input terminal for receiving the second address signal BX<3:1> of the upper 3 bits and an output terminal connected to the first input terminal of the NOR gate 55. The third address signal CX<0> is supplied to the second input terminal of the NOR gate 55. The redundancy decode signal SDaJ is supplied to the gate of the NMOS transistor of the redundancy transfer gate TGas from the output terminal of the NOR gate 55. The redundancy decode signal SDaJ that has been inverted by the inverter circuit 61 is supplied to the gate of the PMOS transistor of the redundancy transfer gate TGas.

The second decoder block 27b includes NOR gates 51–55, NAND gate 56, inverter circuits 57–61, NAND gate 62 and NOR gate 63. Each of the first to fourth NOR gates 51–54 has three input terminals for respectively receiving the first address signal AX<0>, AX<1>, AX<2> or AX<3>, and the second and third address signals BX<1> and CX<0>.

The output terminal of the first NOR gate 51 is connected to the first input terminal of the NOR gate 63 whose second input terminal is connected to the output terminal of the NAND gate 62. The second address signal BX<0> of the least significant bit is supplied to the input terminal of the NAND gate 62. The NOR gate 63 sends the first decode signal SDb0 to the gate of the NMOS transistor of the first transfer gate TGb0. The first decode signal SDb0 that has been inverted by the inverter circuit 57 is supplied to the gate of the PMOS transistor of the first transfer gate TGb0.

The second to fourth NOR gates 52–54 respectively supply the second to fourth decode signals SDb1–SDb3 to the gates of the PMOS transistors of the second to fourth transfer gates TGb1–TGb3. The second to fourth decode signals SDb1–SDb3 that have been inverted by the inverter circuits 58–60 are respectively supplied to the gates of the NMOS transistor of the second to fourth transfer gates TGb1–TGb3.

The NAND gate 56 has an input terminal for receiving the second address signal BX<3:2> of the upper 2 bits and an output terminal connected to the first input terminal of the NOR gate 55. The third address signal CX<0> is supplied to the second input terminal of the NOR gate 55. The NOR gate 55 sends the redundancy decode signal SDbJ to the gate of the NMOS transistor of the redundancy transfer gate TGbs. The redundancy decode signal SDbJ that has been inverted by the inverter circuit 61 is supplied to the gate of the PMOS transistor of the redundancy transfer gate TGbs.

The third decoder block 27c includes NOR gates 51–55, NAND gate 56, inverter circuits 57–61, NAND gate 62 and NOR gate 63. Each of the first to fourth NOR gates 51–54 has three input terminals for respectively receiving the first address signal AX<0>, AX<1>, AX<2> or AX<3>, and the second and third address signals BX<2> and CX<0>.

The output terminal of the first NOR gate 51 is connected to the first input terminal of the NOR gate 63 whose second input terminal is connected to the output terminal of the NAND gate 62. The second address signal BX<1:0> of the lower 2 bits is supplied to the input terminal of the NAND gate 62. The NOR gate 63 sends the first decode signal SDc0 to the gate of the NMOS transistor of the first transfer gate TGc0. The first decode signal SDc0 that has been inverted by the inverter circuit 57 is supplied to the gate of the PMOS transistor of the first transfer gate TGc0.

The second to fourth NOR gates 52–54 respectively supply the second to fourth decode signals SDc1–SDc3 to the gates of the PMOS transistors of the second to fourth transfer gates TGc1–TGc3. The second to fourth decode signals SDc1–SDc3 that have been inverted by the inverter circuits 58–60 are respectively supplied to the gates of the NMOS transistor of the second to fourth transfer gates TGc1–TGc3.

The NAND gate 56 has an input terminal for receiving the second address signal BX<3> of the upper 1 bit and an output terminal connected to the first input terminal of the NOR gate 55. The third address signal CX<0> is supplied to the second input terminal of the NOR gate 55. The NOR gate 55 sends the redundancy decode signal SDcJ to the gate of the NMOS transistor of the redundancy transfer gate TGcs. The redundancy decode signal SDcJ that has been inverted by the inverter circuit 61 is supplied to the gate of the PMOS transistor of the redundancy transfer gate TGcs.

The fourth decoder block 27d is the second or third decoder block 27b or 27c from which the NOR gate 55 and the NAND gate 56 are removed.

Each of the first to fourth NOR gates 51–54 has three input terminals for respectively receiving the first address signal AX<0>, AX<1>, AX<2> or AX<3>, and the second and third address signals BX<3> and CX<0>.

The output terminal of the first NOR gate 51 is connected to the first input terminal of the NOR gate 63 whose second input terminal is connected to the output terminal of the NAND gate 62. The second address signal BX<2:0> of the lower 3 bits is supplied to the input terminal of the NAND gate 62. The NOR gate 63 sends the first decode signal SDd0 to the gate of the NMOS transistor of the first transfer gate TGd0. The first decode signal SDd0 that has been inverted by the inverter circuit 57 is supplied to the gate of the PMOS transistor of the first transfer gate TGd0.

The second to fourth NOR gates 52–54 respectively supply the second to fourth decode signals SDd1–SDd3 to the gates of the PMOS transistors of the second to fourth transfer gates TGd1–TGd3. The second to fourth decode signals SDd1–SDd3 that have been inverted by the inverter circuits 58–60 are respectively supplied to the gates of the NMOS transistor of the second to fourth transfer gates TGd1–TGd3.

The third address signal CX<0> or the redundancy decode signal SDdJ is supplied to the gate of the NMOS transistor of the redundancy transfer gate TGds. The redundancy decode signal SDdJ that has been inverted by the inverter circuit 61 is supplied to the gate of the PMOS transistor of the redundancy transfer gate TGds.

Figure 8:
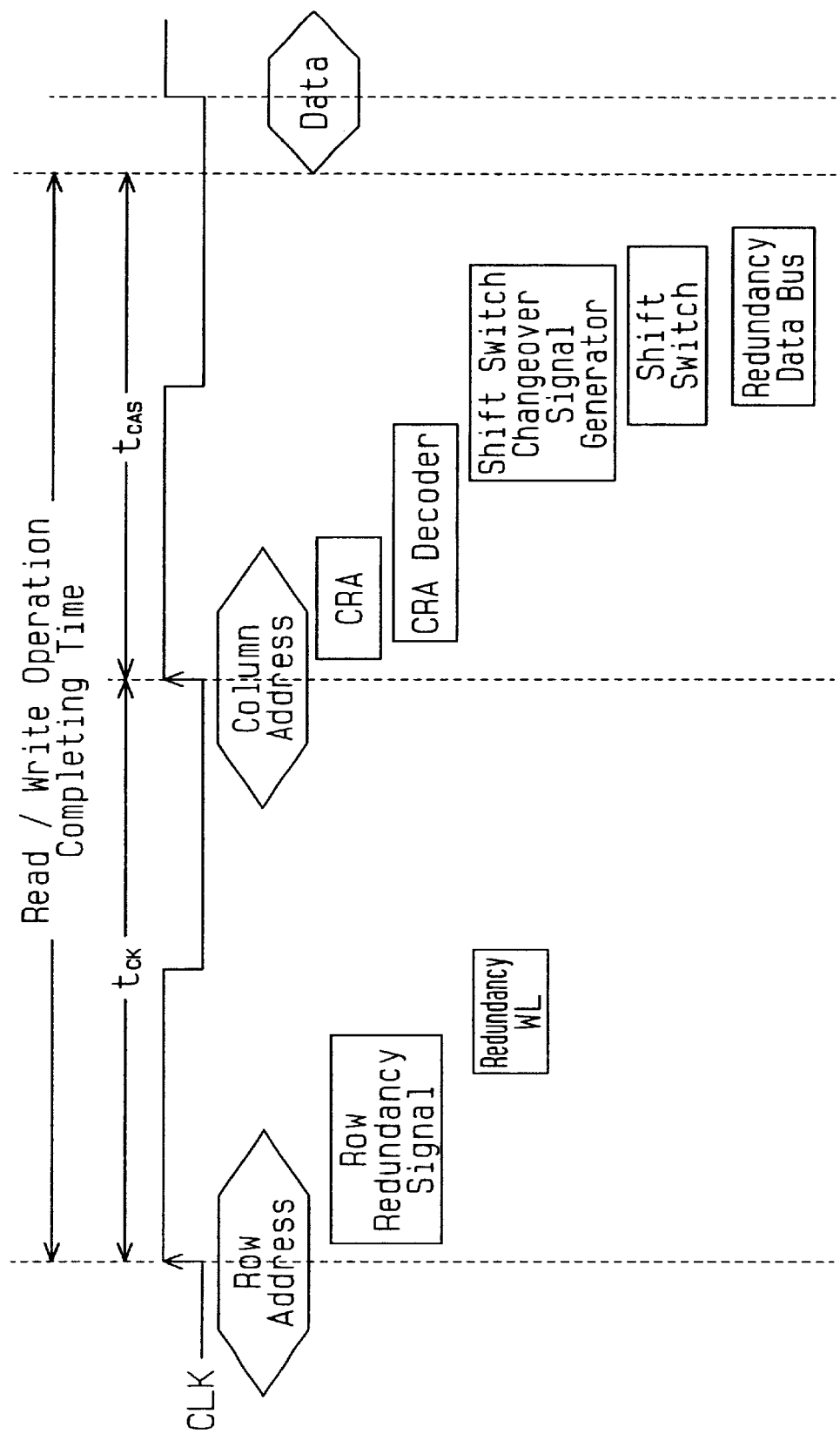
FIG. 8 is a signal waveform diagram for the semiconductor memory device in FIG. 3.

The operation of the semiconductor memory device will now be described referring to FIG. 8.

First, the semiconductor memory device 20 receives the row address at the rising of a clock signal CLK and generates the row redundancy signal, thereby selecting a redundancy word line (WL).

Next, the semiconductor memory device 20 receives the column address at the next rising of the clock signal CLK and generates the column redundancy address CRA. The column redundancy address decoder 27 decodes the column redundancy address CRA and sends a redundancy decode signal to the shift-switch changeover signal generator 26. The signal generator 26 controls the shift switch 25 in accordance with the redundancy decode signal. The data bus line is switched to the redundancy data bus line in this manner.

The time that is needed to complete the switching operation since the reception of the column address is shorter than a Column Access Strobe (CAS) access time $t_{CAS}$. The CAS access time $t_{CAS}$ is the time needed for the output data to be established since a column address strobe signal has changed. That is, the switching of the redundancy data bus is completed within a specified data writing time or data reading time.

The semiconductor memory device 20 of this embodiment has the following advantages.

The changeover signal generator 26 includes the plurality of signal generating blocks 26a–26d each of which includes four transfer gates and one redundancy transfer gate. Four changeover signals are supplied to the four shift switches from the nodes between those transfer gates. The delay time for each of the four changeover signals is therefore determined only by the RC delay of four transfer gates at a maximum. This shortens the operation time from the initiation of the shift operation to the completion of the switching of the shift switches, thereby shortening the data reading and writing times.

This embodiment may be modified as follows:

The number of signal generating blocks of the changeover signal generator 26 may be changed according to the number of bits of the data bus lines, the circuit area and a specified time, such as the CAS access time $t_{CAS}$.

Figure 11:
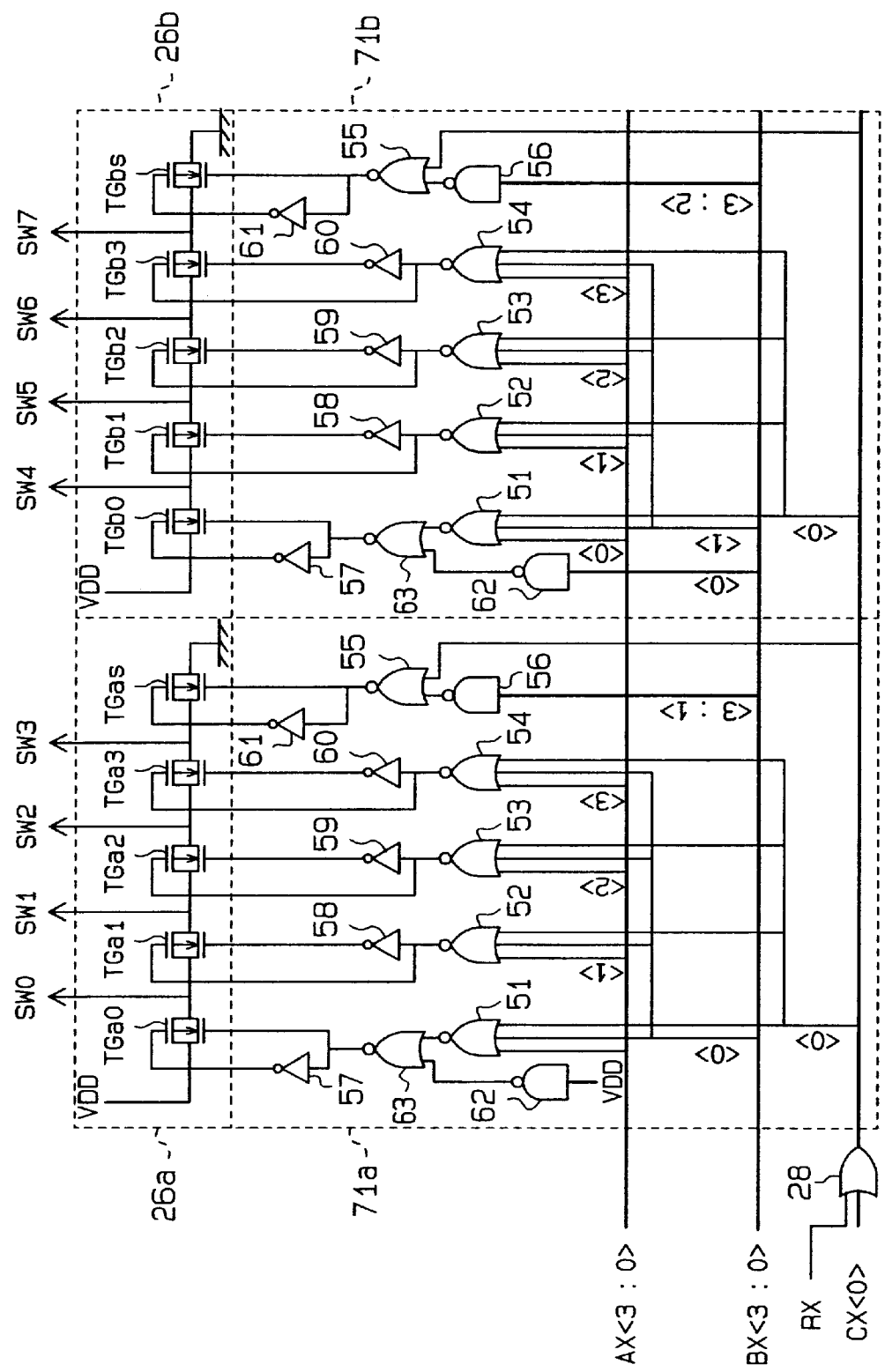
FIG. 11 is a schematic circuit diagram of a column redundancy address decoder and a shift-switch changeover signal generator according to a first modification.
Figure 12:
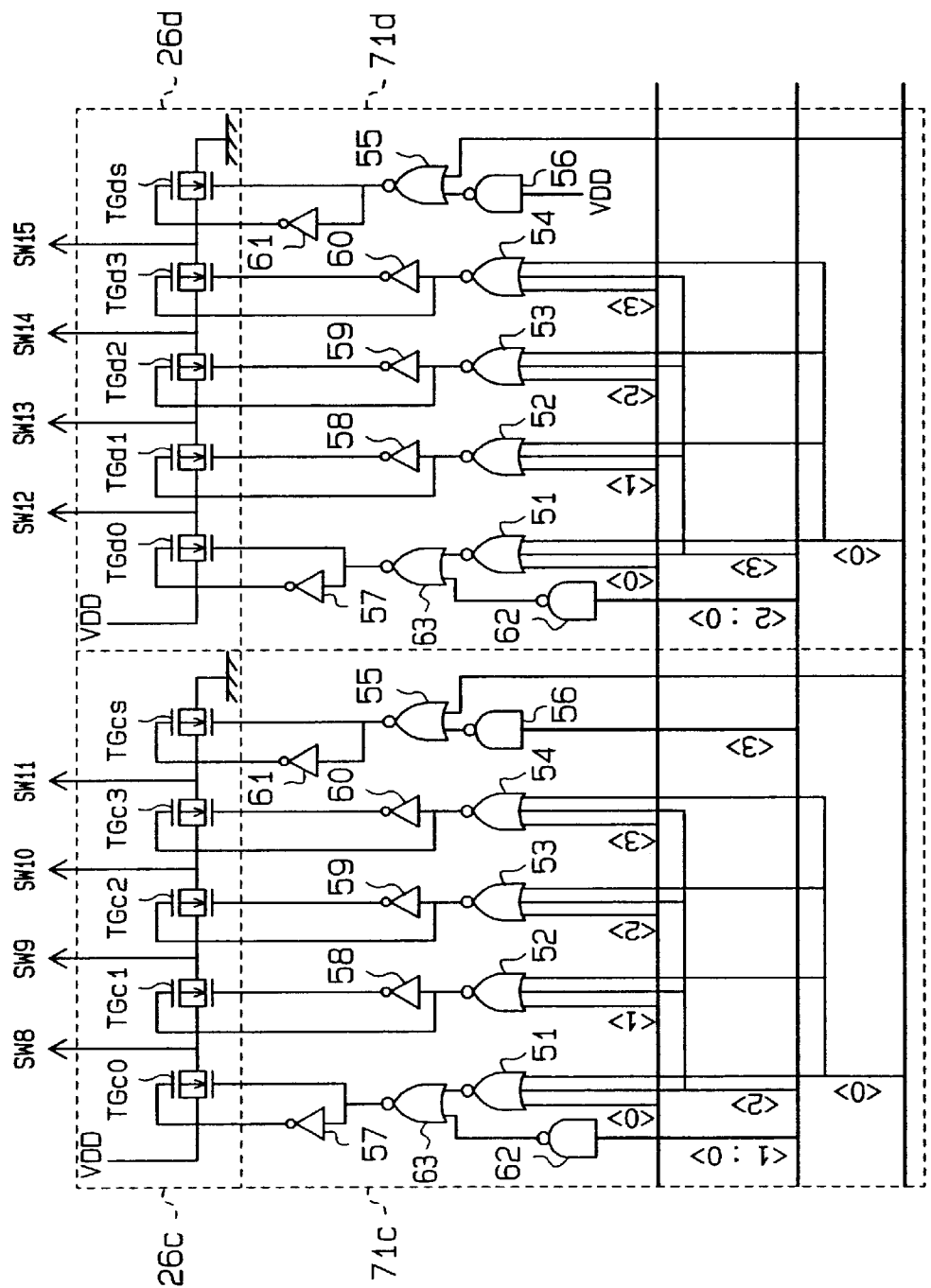
FIG. 12 is a schematic circuit diagram of a column redundancy address decoder and a shift-switch changeover signal generator according to a second modification.

First to fourth decoder blocks 71a to 71d shown in FIGS. 11 and 12 may be used in place of the first to fourth decoder blocks 27a–27d. As shown in FIGS. 11 and 12, the first to fourth decoder blocks 71a–71d have the same structure. The high-potential power supply VDD is connected to the NAND gate 62 of the first decoder block 71a. The high-potential power supply VDD is connected to the NAND gate 56 of the fourth decoder block 71d. Because the first to fourth decoder blocks 71a–71d have the same structure, it becomes easier to adapt to a design change of increasing the number of data bus lines.

The number of data bus lines, the number of bits of the input/output data lines and the total number of the redundancy data bus lines for each redundancy unit may be changed as needed.

Figure 5A:
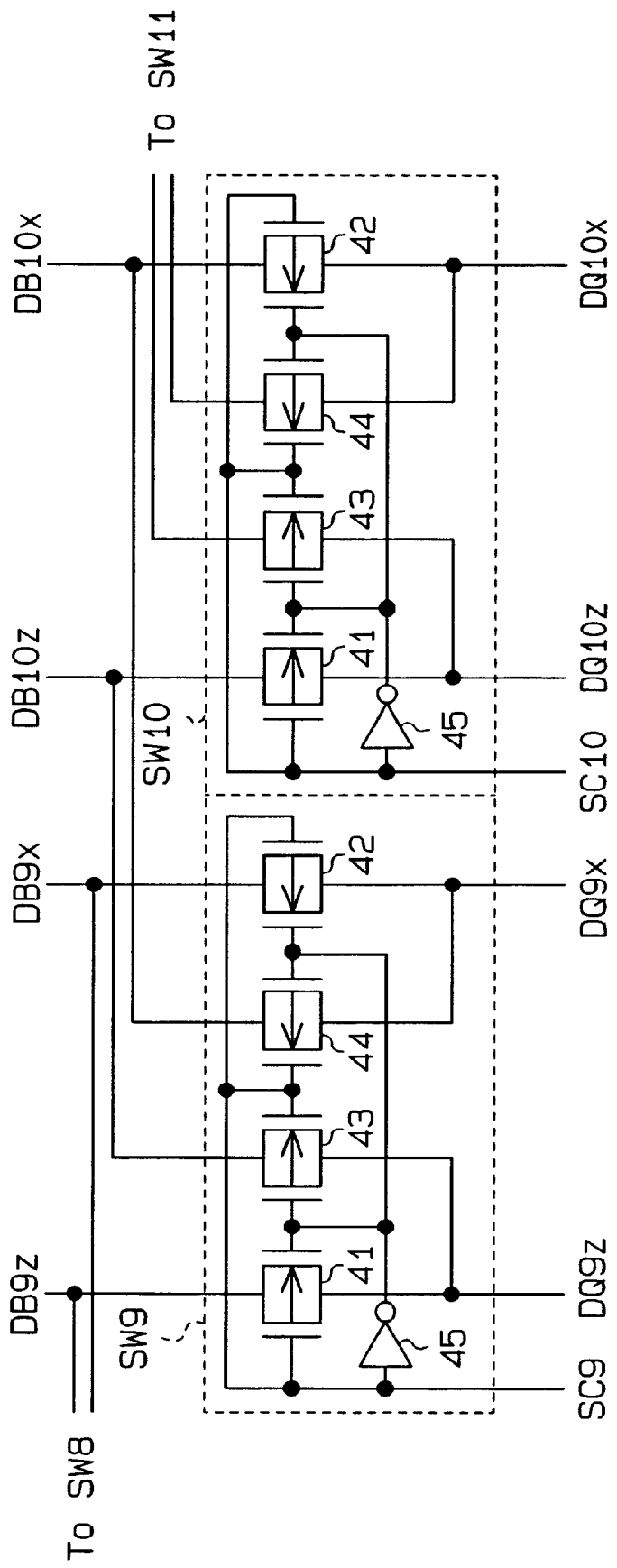
FIG. 5A is a schematic circuit diagram of shift switches in the redundancy circuit in FIGS. 4A and 4B.
Figure 5B:
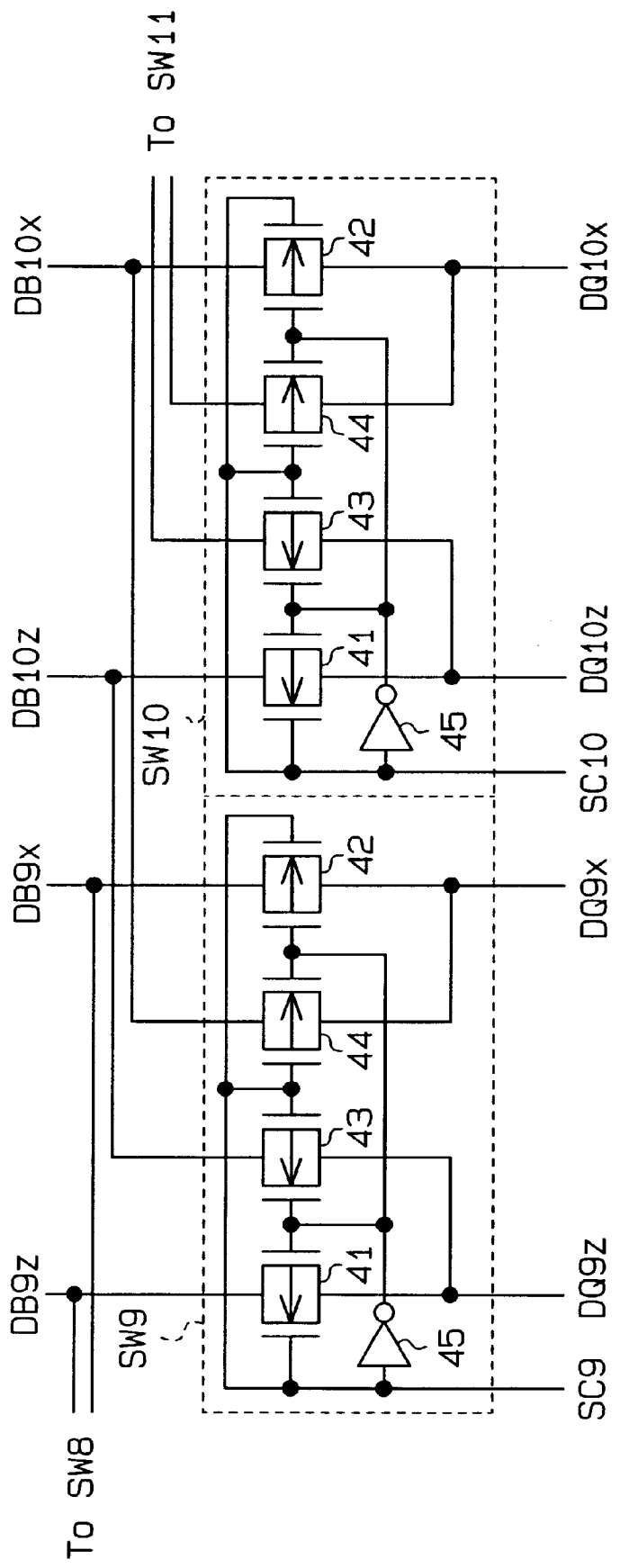
FIG. 5B is another example of the type of circuit shown in FIG. 5A.

The shift switch 25 of FIG. 5A can be changed to the shift switch 25 of FIG. 5B.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A semiconductor memory device comprising:
   a plurality of input/output data lines;
   at least two groups of data bus lines;
   at least one redundancy data bus line;
   a plurality of shift switches for switching connections of the plurality of input/output data lines and a first group of the plurality of data bus lines to connections of the plurality of input/output data lines and a second group of the data bus lines, which exclude at least one defective data bus line, and the at least one redundancy data bus line in response to a plurality of changeover signals; and
   a changeover signal generating circuit, connected to the plurality of shift switches, for generating the plurality of changeover signals including a first group of changeover signals and a second group of changeover signals in response to a redundancy address signal, the changeover signal generating circuit having a plurality of signal generating blocks including a first signal generating block for generating the first group of changeover signals and a second signal generating block for generating the second group of changeover signals.

2. A semiconductor memory device comprising:
   a plurality of input/output data lines;
   a plurality of data bus lines;
   at least one redundancy data bus line;
   a plurality of shift switches for switching connections of the plurality of input/output data lines and a first group of the plurality of data bus lines to connections of the plurality of input/output data lines and a second group of the data bus lines, which exclude at least one defective data bus line, and the at least one redundancy data bus line in response to a plurality of changeover signals;
   a decoder circuit for decoding a redundancy address signal and generating a decoded redundancy address signal; and
   a changeover signal generating circuit, connected to the decoder circuit and the plurality of shift switches, for generating the plurality of changeover signals including a first group of changeover signals and a second group of changeover signals in response to the decoded redundancy address signal, the changeover signal generating circuit having a plurality of signal generating blocks including a first signal generating block for generating the first group of changeover signals and a second signal generating block for generating the second group of changeover signals, each signal generating block including a plurality of switches which are connected in series between a high-potential power supply and a low-potential power supply and are controlled by the decoded redundancy address signal.

3. The semiconductor memory device according to claim 2, wherein each of the signal generating blocks include a plurality of switches and at least one redundancy switch.

4. The semiconductor memory device according to claim 3, wherein each of the plurality of switches and the redundancy switch is a CMOS transfer gate.

5. The semiconductor memory device according to claim 3, wherein the decoder circuit includes a plurality of decoder blocks respectively corresponding to the plurality of signal generating blocks; wherein the decoder block which corresponds to a defective data bus line generates a first decoded address signal such that the defective data bus line is switched to the at least one redundancy data bus line; and at least one decoder block other than the decoder block corresponding to the defective data bus line generates a second decoded address signal such that at least one switch is switched off and at least another one switch is switched on.

6. The semiconductor memory device according to claim 5, wherein the decoder blocks are comprised of identical elements.

7. The semiconductor memory device according to claim 5, wherein the at least one decoder block other than the decoder block corresponding to the defective data bus line generates the second decoded address signal such that a switch which is connected to one of the high potential power supply and the low potential power supply is switched and the redundancy switch is switched.

8. The semiconductor memory device according to claim 3, wherein a number of the plurality of switches is according to a formula, (m/n), wherein m represents the number of input/output data lines, and n represents a number of signal generating blocks being an integer equal or greater than 2, and C represents a number of the at least one redundancy switch.

9. The semiconductor memory device according to claim 3, wherein the decoder circuit includes a plurality of decoder blocks respectively corresponding to the plurality of signal generating blocks; wherein the decoder block which corresponds to a defective data bus line generates a first decoded address signal such that the defective data bus line is switched to the at least one redundancy data bus line.

10. The semiconductor memory device according to claim 2, wherein the semiconductor memory device further comprises:
    a memory cell array including a plurality of memory cell blocks connected to the plurality of data bus lines, wherein each memory cell block includes a plurality of memory cells; and
    a row block address determination circuit, connected to the decoder circuit, for receiving a row block address and a redundancy address, determining whether the memory cell block which is selected by the row block address contains a defective memory cell, and generating a determination signal, the decoder circuit generating the decoded redundancy address signal in response to the determination signal.

11. A method of performing a redundancy process for compensating a semiconductor memory device for a defective memory cell, comprising the steps of:
    decoding a redundancy address signal and generating a decoded redundancy address signal;
    generating a plurality of changeover signals including a first group of changeover signals and a second group of changeover signals by operating a plurality of signal generating blocks in response to the decoded redundancy address signal; and
    switching connections of a plurality of input/output data lines and a first group of a plurality of data bus lines to connections of the plurality of input/output data lines and a second group of the data bus lines, which exclude at least one defective data bus line, and at least one redundancy data bus line by operating a plurality of shift switches in response to the plurality of changeover signals.

12. The method according to claim 11, wherein each of the signal generating blocks include a plurality of switches connected in series between a high-potential power supply and a low-potential power supply; and
    the step of generating the plurality of changeover signals generates a group of changeover signals utilizing the plurality of switches in each of the signal generating blocks in response to the decoded redundancy address signal.

13. The method according to claim 11, wherein each of the signal generating blocks include a plurality of switches and at least one redundancy switch.

14. The method according to claim 13, wherein the step of generating the decoded address signal includes the steps of:
    generating a first decoded address signal such that, in that signal generating block which corresponds to a data bus line connected to a defective memory cell, a switch which corresponds to the data bus line connected to the defective data bus line is switched off and the redundancy switch is switched on; and
    generating a second decoded address signal such that, in at least one signal generating block other than the signal generating block corresponding to the data bus line connected to the defective data bus line, a switch which is connected directly to the high-potential power supply is switched off and the redundancy switch is switched on.

15. The semiconductor memory device according to claim 13, wherein a number of the plurality of switches is according to a formula, (m/n), wherein m represents the number of input/output data lines, and n represents an integer equal or greater than 2, and C represents a number of the at least one redundancy switch.

* * * * *